(12) United States Patent
Ashida

(10) Patent No.: US 7,342,987 B2
(45) Date of Patent: Mar. 11, 2008

(54) 90-DEGREE PHASE SHIFTER

(75) Inventor: Nobuyuki Ashida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 610 days.

(21) Appl. No.: 11/007,212

(22) Filed: Dec. 9, 2004

(65) Prior Publication Data

US 2005/0129157 A1   Jun. 16, 2005

(30) Foreign Application Priority Data

Dec. 11, 2003   (JP) .............................. 2003-413635

(51) Int. Cl.
*H04L 23/00* (2006.01)
(52) U.S. Cl. ...................... 375/377; 375/329; 375/261; 375/279; 327/231; 327/255; 327/238
(58) Field of Classification Search ................ 375/377, 375/329, 261, 279; 327/231, 255, 238
See application file for complete search history.

(56) References Cited

U.S. PATENT DOCUMENTS

| 4,663,594 A | * | 5/1987 | Perkins ........................ 327/240 |
| 4,857,777 A | * | 8/1989 | Altes ........................... 327/255 |
| 6,160,434 A | * | 12/2000 | Yoshimura et al. ......... 327/238 |
| 6,356,131 B1 | * | 3/2002 | Kuwano ...................... 327/255 |
| 6,903,591 B2 | * | 6/2005 | Arimura et al. ............. 327/231 |

FOREIGN PATENT DOCUMENTS

| JP | 7-30346 A | 1/1995 |
| JP | 8-70464 A | 3/1996 |
| JP | 8-237077 A | 9/1996 |
| JP | 2002-152011 A | 5/2002 |

* cited by examiner

*Primary Examiner*—Phuong Phu
(74) *Attorney, Agent, or Firm*—Birch, Stewart, Kolasch & Birch, LLP

(57) ABSTRACT

The 90-degree phase shifter of the invention has: a T flip-flop including transistors Q3 to Q6 and Q9 to Q12 that together constitute a dual differential circuit, input transistors Q1 and Q2 that receive at their bases an input signal, and input transistors Q7 and Q8 that receive at their bases a signal complementary to the input signal; variable current sources 14 to 17 connected respectively to the nodes between the individual input transistors and the dual differential circuit; and a 90-degree phase comparator 10 that compares the phase differences between the signals outputted from the T flip-flop to output signals commensurate with the deviations of those phase differences from 90 degrees. The variable current sources 14 to 17 are controlled by signals based on the signals outputted from the 90-degree phase comparator 10. This configuration more surely yields output signals with a phase difference of exactly 90 degrees.

8 Claims, 5 Drawing Sheets

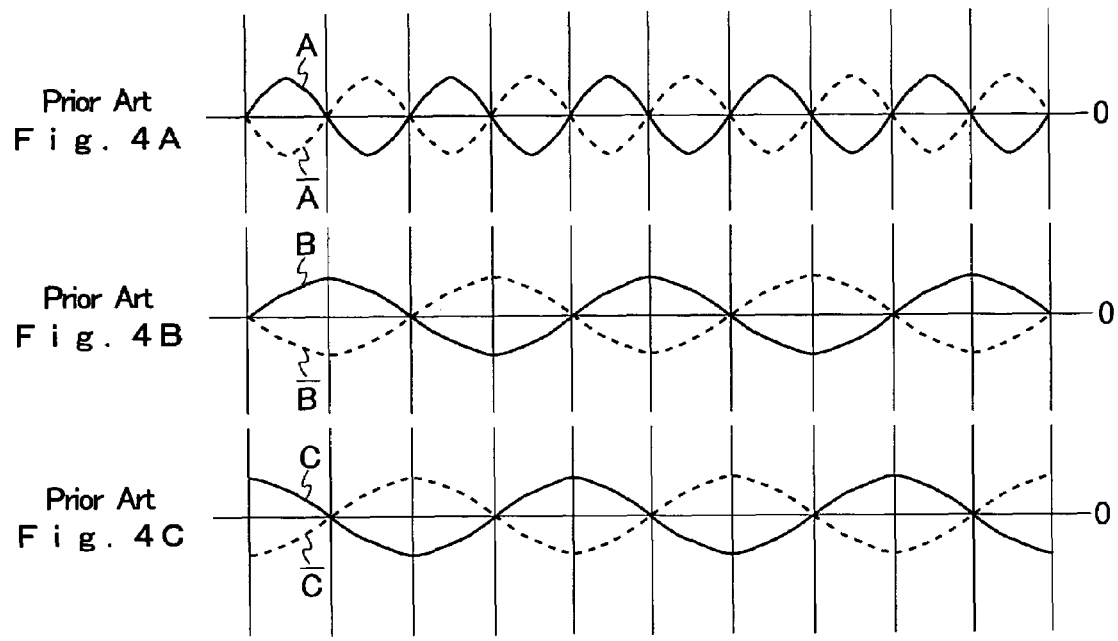
Prior Art Fig. 4A
Prior Art Fig. 4B
Prior Art Fig. 4C
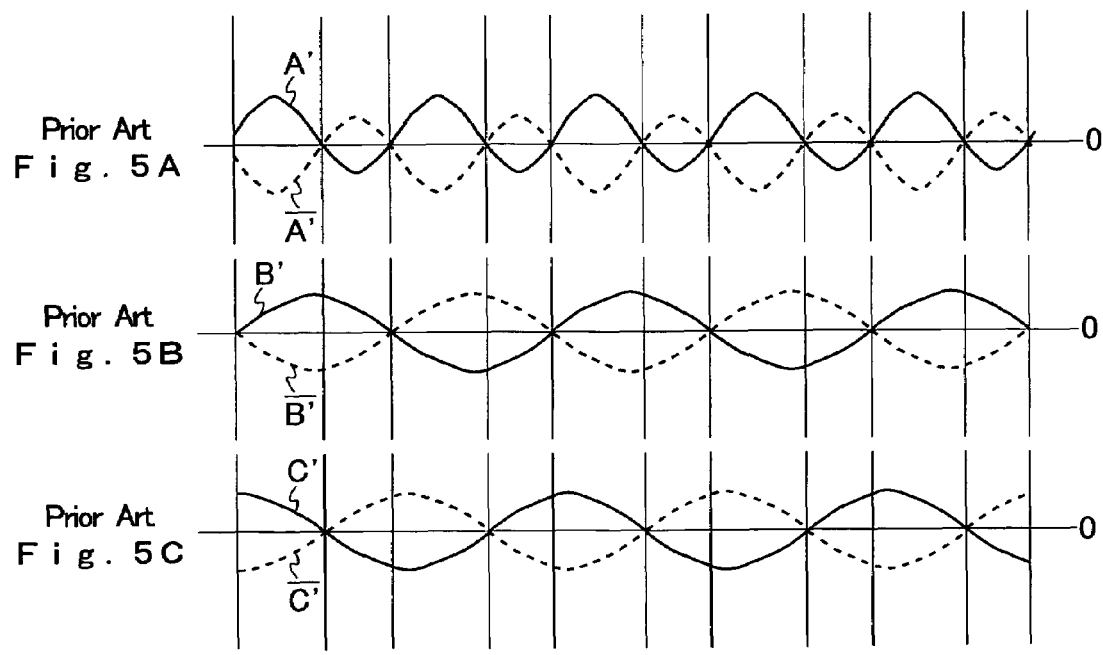
Prior Art Fig. 5A
Prior Art Fig. 5B
Prior Art Fig. 5C

90-DEGREE PHASE SHIFTER

This nonprovisional application claims priority under 35 U.S.C. § 119(a) on Patent Application No. 2003-413635 filed in Japan on Dec. 11, 2003, the entire contents of which are hereby incorporated by reference.

BACKGROUND OF THE INVENTION

1. Field of the Invention

The present invention relates to a 90-degree phase shifter, and more particularly to a 90-degree phase shifter that is built using a T flip-flop.

2. Description of Related Art

An example of the configuration of a conventional 90-degree phase shifter is shown in FIG. 3. The conventional 90-degree phase shifter shown in FIG. 3 is a 90-degree phase shifter built using a T flip-flop, and is composed of transistors Q1 to Q12, resistors R1 to R4, input terminals 1 and 2, constant current sources 3 and 4, a constant voltage source 5, and output terminals 6 to 9.

When an input signal having a predetermine frequency and having a duty factor of 50% is fed in via the input terminal 1, the input transistors Q1 and Q8, of which the bases are connected to the input terminal 1, repeatedly turn on and off according to the input signal. When a signal complementary to the input signal is fed in via the input terminal 2, the input transistors Q2 and Q7, of which the bases are connected to the input terminal 2, repeatedly turn on and off with the timing opposite to that with which the input transistors Q1 and Q8 turn on and off.

As a result, a first frequency-divided signal (0-degreee signal), which is a signal obtained by performing ½ frequency division on the input signal and of which the zero cross points are synchronous with the rising zero cross points of the input signal is fed out via the output terminal 6, and a signal (180-degree signal) complementary to the first frequency-divided signal is fed out via the output terminal 7. Moreover, a second frequency-divided signal (90-degreee signal), which is a signal obtained by performing ½ frequency division on the input signal and of which the zero cross points are synchronous with the trailing zero cross points of the input signal is fed out via the output terminal 8, and a signal (270-degree signal) complementary to the second frequency-divided signal is fed out via the output terminal 9.

When the input signal is free of any DC offset or distortion, the input and output signals behave, for example, as shown in the time chart in FIGS. 4A to 4C. In FIG. 4A, A indicates the input signal that is fed in via the input terminal 1, A-bar (overscored A) indicates the input signal fed in via the input terminal 2. In FIG. 4B, B indicates the output signal fed out via the output terminal 6, and B-bar (overscored B) indicates the output signal fed out via the output terminal 7. In FIG. 4C, C indicates the output signal fed out via the output terminal 8, and C-bar (overscored C) indicates the output signal fed out via the output terminal 9. When the T flip-flop operates in an ideal manner on an ideal input signal like the input signal A, the phase difference between the two output signals (the output signals B and C) is exactly 90 degrees.

On the other hand, if the input signal contains any DC offset and/or distortion, or if the circuit elements that constitute the T flip-flop have variations in their characteristics among them, the phase difference between the two output signals, undesirably, deviates from 90 degrees. For example, if the input signal contains a DC offset, the input and output signals behave, for example, as shown in the time chart in FIGS. 5A to 5C. In FIG. 5A, A' indicates the input signal that is fed in via the input terminal 1, A'-bar (overscored A') indicates the input signal fed in via the input terminal 2. In FIG. 5B, B' indicates the output signal fed out via the output terminal 6, and B'-bar (overscored B') indicates the output signal fed out via the output terminal 7. In FIG. 5C, C' indicates the output signal fed out via the output terminal 8, and C'-bar (overscored C') indicates the output signal fed out via the output terminal 9. Since the input signal A' contains a DC offset, its duty factor is not exactly 50%, and this deviation causes the phase difference between the two output signals (the output signals B' and C') to deviate from 90 degrees.

A 90-degree phase shifter designed to offer a solution to the above problem is proposed in Japanese Patent Application Laid-Open No. H8-237077. The 90-degree phase shifter proposed in this publication is configured as shown in FIG. 6. In FIG. 6, such circuit elements as find their counterparts in FIG. 3 are identified with common reference numerals or symbols.

As compared with the conventional 90-degree phase shifter shown in FIG. 3, the conventional 90-degree phase shifter shown in FIG. 6 is additionally provided with a 90-degree phase comparator 10, a low-pass filter 11, a DC amplifier 12, and capacitors C1 and C2.

In the conventional 90-degree phase shifter shown in FIG. 6, the 90-degree phase comparator 10 detects the phase deviation from 90 degrees. The low-pass filter 11 and the DC amplifier 12 extract, from the output of the 90-degree phase comparator 10, the direct-current component that corresponds to the phase deviation, and then feed it back to the control terminal (base) of each of the input transistors Q1, Q2, Q7, and Q8. This permits a direct-current bias to be applied to the base of each of the input transistors Q1, Q2, Q7, and Q8 in such a way as to correct the phase deviation from 90 degrees, eventually eliminating it.

The conventional 90-degree phase shifter shown in FIG. 6, however, has the following disadvantages. First, since the phase deviation from 90 degrees is fed back as a voltage, how it is fed back tends to be influenced by noise. Second, also since the phase deviation from 90 degrees is fed back as a voltage, how it is fed back tends to be influenced also by the voltage drop across the wiring resistance of the path by way of which it is fed back. Incidentally, since a 90-degree phase shifter is typically built into an integrated circuit, the just mentioned wiring resistance is usually comparatively high.

Hence, under the influence of noise or of the voltage drop across the wiring resistance as described above, the conventional 90-degree phase shifter shown in FIG. 6, inconveniently, does not always yield output signals with a phase difference of exactly 90 degrees.

SUMMARY OF THE INVENTION

An object of the present invention is to provide a 90-degree phase shifter that more surely yields output signals with a phase difference of exactly 90 degrees.

To achieve the above object, according to the present invention, a 90-degree phase shifter is provided with:

a T flip-flop including
first and second input transistors that receive at the control terminals thereof an input signal,
third and fourth input transistors that receive at the control terminals thereof a signal complementary to the input signal, and a dual differential circuit that operates according to the switching operation of the first to fourth input transistors;

a first variable current source that is connected to the node between the first input transistor and the dual differential circuit;

a second variable current source that is connected to the node between the second input transistor and the dual differential circuit;

a third variable current source that is connected to the node between the third input transistor and the dual differential circuit;

a fourth variable current source that is connected to the node between the fourth input transistor and the dual differential circuit; and a phase comparator that compares the phase differences between the signals outputted from the T flip-flop in order to output signals commensurate with the results of the comparison.

Here, the first to fourth variable current sources are controlled by signals based on the signals outputted from the phase comparator.

In this configuration, the deviations from 90 degrees of the phase differences between the signals outputted from the T flip-flop are fed back as the currents produced by the first to fourth variable current sources. Thus, even if the input signal, despite having a predetermined frequency, has a duty factor other than 50%, the phase differences between the signals outputted from the T flip-flop can be so adjusted as to be exactly 90 degrees.

Moreover, feeding back the phase deviations from 90 degrees as the currents produced by the first to fourth variable current sources minimizes the susceptibility to noise. Furthermore, now that the phase deviations from 90 degrees are fed back as currents, by making as short as possible the wiring from the phase comparator to the first to fourth variable current sources, even if the wiring from the nodes between the first to fourth input transistors and the dual differential circuit to the first to fourth variable current sources is long, it is possible to minimize the susceptibility to the voltage drops across the wiring resistances of the paths by way of which the phase deviations from 90 degrees need to be fed back. In this way, it is possible to more surely yield output signals with a phase difference of exactly 90 degrees.

In the 90-degree phase shifter configured as described above, a low-pass filter may be provided between the phase comparator and the first to fourth variable current sources. With this configuration, it is possible to eliminate the alternating-current component contained in the output signals of the phase comparator. This makes it possible to perform feedback control accurately according to the results of the phase comparison by the phase comparator. In this way, it is possible to yield output signals with a phase difference of more exactly 90 degrees.

In any of the 90-degree phase shifters configured as described above, an amplifier may be provided between the phase comparator and the first to fourth variable current sources. With this configuration, it is possible to increase the loop gain of the feedback loop, and thus to perform feedback control with high accuracy. In this way, it is possible to yield output signals with a phase difference of more exactly 90 degrees.

In any of the 90-degree phase shifters configured as described above, a limiter may be provided that limits the variable range of the first to fourth variable current sources. With this configuration, even if the circuit elements that constitute the T flip-flop have variations in their characteristics among them, the balance between the twin portions of the dual differential circuit is not seriously upset thereby. Thus, even at start-up, the T flip-flop surely performs ½ frequency division. Once the T flip-flop starts to perform ½ frequency division, it is possible, through feedback control, to yield output signals with a phase difference of exactly 90 degrees.

BRIEF DESCRIPTION OF THE DRAWINGS

FIGS. 4A to 4C are diagrams showing an example of the time chart showing the behavior of the input and output signals as observed when the 90-degree phase shifter shown in FIG. 3 is fed with an input signal containing no DC offset or distortion.

FIGS. 5A to 5C are diagrams showing an example of the time chart showing the behavior of the input and output signals as observed when the 90-degree phase shifter shown in FIG. 3 is fed with an input signal containing a DC offset.

DETAILED DESCRIPTION OF PREFERRED EMBODIMENTS

Figure 1:
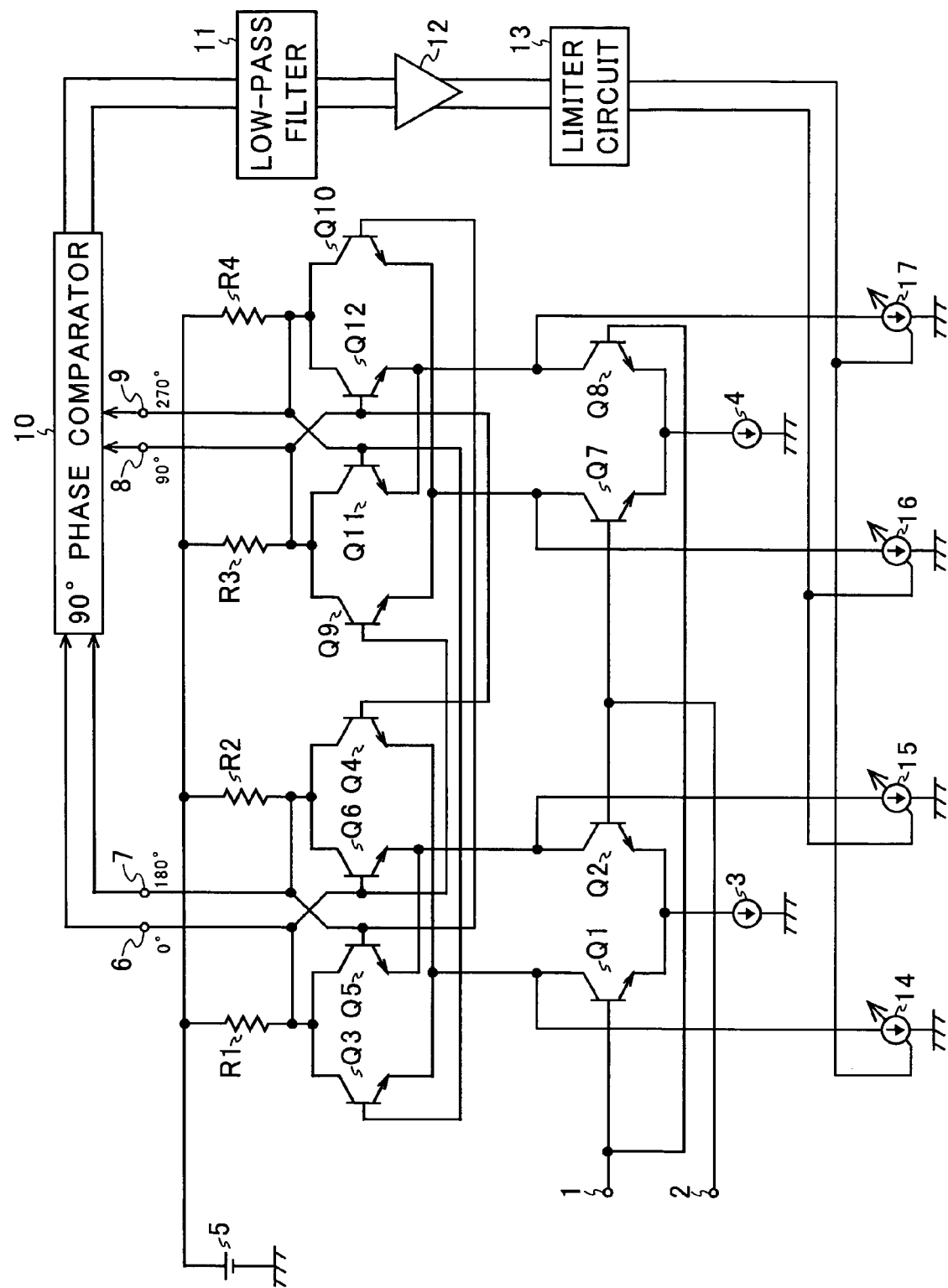
FIG. 1 is a diagram showing the configuration of a 90-degree phase shifter according to the invention.
Figure 6:
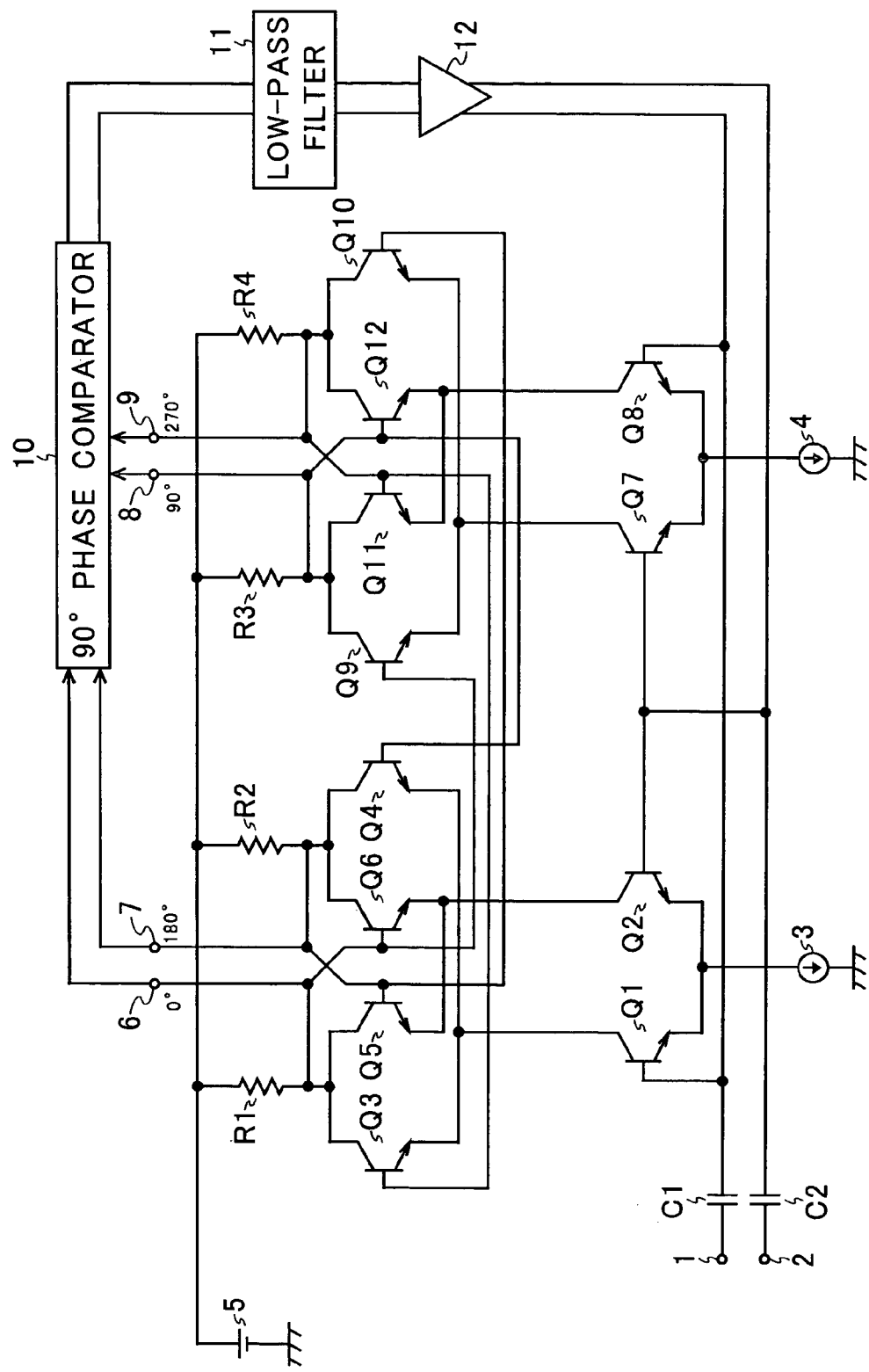
FIG. 6 is a diagram showing another configuration of a conventional 90-degree phase shifter.

Hereinafter, an embodiment of the present invention will be described with reference to the accompanying drawings. An example of the configuration of a 90-degree phase shifter according to the invention is shown in FIG. 1. In FIG. 1, such circuit elements as find their counterparts in FIG. 6 are identified with common reference numerals or symbols.

Figure 3:
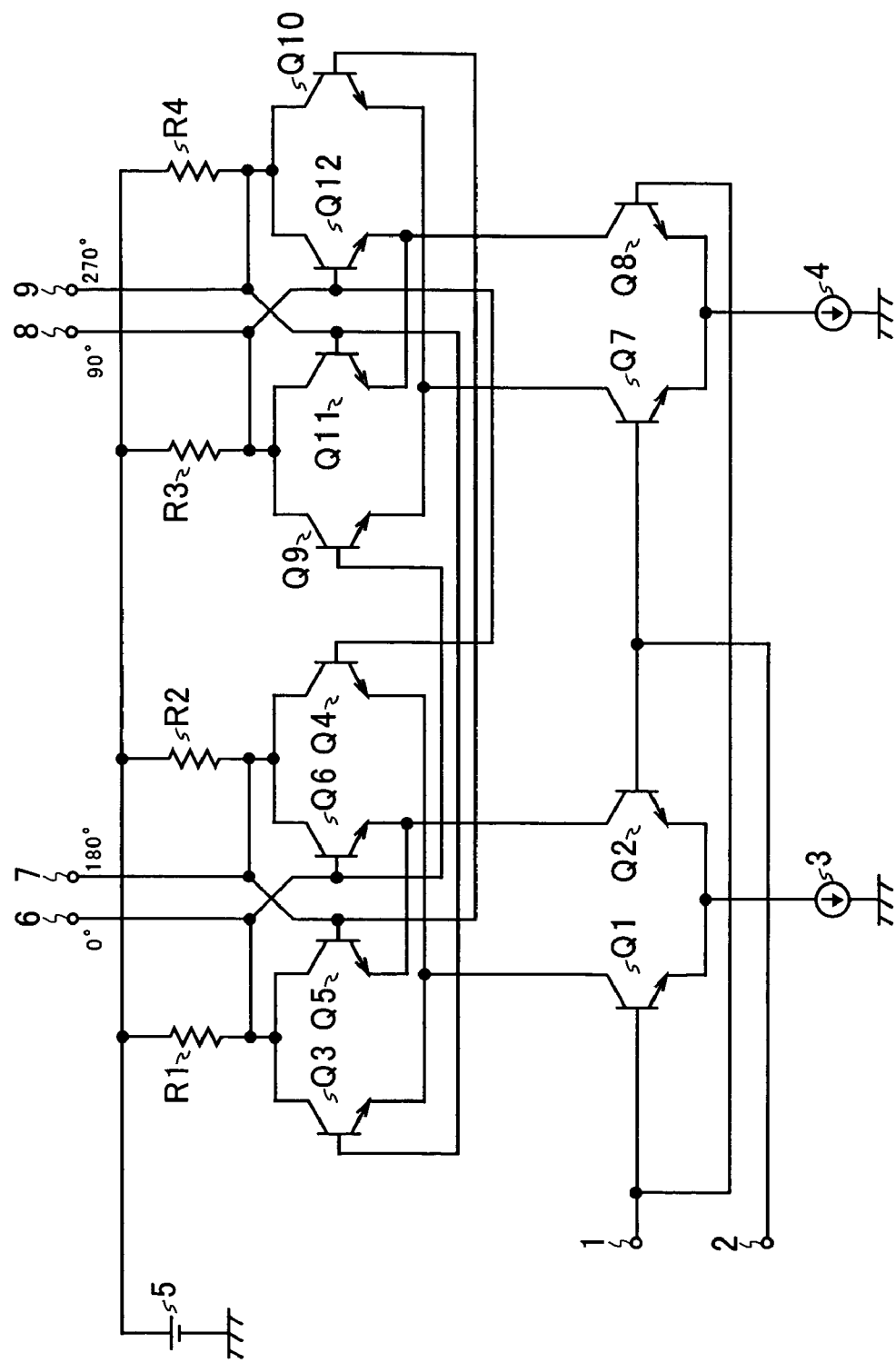
FIG. 3 is a diagram showing one configuration of a conventional 90-degree phase shifter.

As compared with the conventional 90-degree phase shifter shown in FIG. 3, the 90-degree phase shifter according to the invention shown in FIG. 1 is additionally provided with a 90-degree phase comparator 10, a low-pass filter 11, a DC amplifier 12, a limiter circuit 13, and variable current sources 14 to 17.

NPN-type transistors Q1 to Q12, input terminals 1 and 2, constant current sources 3 and 4, resistors R1 to R4, a constant voltage source 5, and output terminals 6 to 9 together constitute a T flip-flop that functions as a ½ frequency divider. The input terminal 1 is connected to the base of the input transistor Q1 and to the base of the input transistor Q8, and the input terminal 2 is connected to the base of the input transistor Q2 and to the base of the input transistor Q7. The emitter of the input transistor Q1 and the emitter of the input transistor Q2 are connected together, and are grounded through the constant current source 3. The emitter of the input transistor Q7 and the emitter of the input transistor Q8 are connected together, and are grounded through the constant current source 4.

The collector of the input transistor Q1 is connected to the node between the emitter of the transistor Q3 and the emitter of the transistor Q4, and the collector of the input transistor Q2 is connected to the node between the emitter of the transistor Q5 and the emitter of the transistor Q6.

The collector of the input transistor Q7 is connected to the node between the emitter of the transistor Q9 and the emitter of the transistor Q10, and the collector of the input transistor Q8 is connected to the node between the emitter of the transistor Q11 and the emitter of the transistor Q12.

The base of the transistor Q3 is connected to the base of the transistor Q11, to the output terminal 9, to the collector of the transistor Q10, and to the collector of the transistor Q12, and is also connected through the resistor R4 to the positive terminal of the constant voltage source 5. The base of the transistor Q5 is connected to the base of the transistor Q10, to the output terminal 7, to the collector of the transistor Q6, and to the collector of the transistor Q4, and is also connected through the resistor R2 to the positive terminal of the constant voltage source 5.

The base of the transistor Q6 is connected to the base of the transistor Q9, to the output terminal 6, to the collector of the transistor Q3, and to the collector of the transistor Q5, and is also connected through the resistor R1 to the positive terminal of the constant voltage source 5. The base of the transistor Q4 is connected to the base of the transistor Q12, to the output terminal 8, to the collector of the transistor Q9, and to the collector of the transistor Q11, and is also connected through the resistor R3 to the positive terminal of the constant voltage source 5. The negative terminal of the constant voltage source 5 is grounded.

The outputs of the T flip-flop configured as described above and functioning as a ½ frequency divider are fed to the 90-degree phase comparator 10, which detects the phase difference between the output signal fed out via the output terminal 6 and the output signal fed out via the output terminal 8 and outputs two-phase direct-current voltages the voltage difference between which is commensurate with the deviation of the detected phase difference from 90 degrees. The output signals of the 90-degree phase comparator 10 usually contain, in addition to the direct-current components that indicate the result of the phase comparison, alternating-current components having frequencies related to the frequency of the signals that the 90-degree phase comparator 10 receives. These alternating-current components, if left contained in the output signals of the 90-degree phase comparator 10, make it impossible to perform feedback control accurately according to the result of the phase comparison. For this reason, in this embodiment, the low-pass filter 11 is provided in the stage succeeding the 90-degree phase comparator 10. The low-pass filter 11 eliminates the alternating-current components from the output signals of the 90-degree phase comparator 10.

To perform feedback control with high accuracy, it is necessary that the feedback loop have a sufficiently high loop gain. For this reason, in this embodiment, the DC amplifier 12 is provided in the stage succeeding the low-pass filter 11. The DC amplifier 12 amplifies the output signals of the low-pass filter 11.

Moreover, in this embodiment, the limiter circuit 13 is provided in the stage succeeding the low-pass filter 11. When the output signals of the DC amplifier 12 are within a predetermined range, the limiter circuit 13 outputs them intact; when the output signals of the DC amplifier 12 are out of the predetermined range, the limiter circuit 13 outputs them after correcting them so that they are within the predetermined range.

Of the two-phase direct-current voltages outputted from the limiter circuit 13, one controls the currents produced by the variable current sources 14 and 17, and the other controls the currents produced by the variable current sources 15 and 16.

The variable current source 14 extracts a current from the node among the collector of the input transistor Q1, the emitter of the transistor Q3, and the emitter of the transistor Q4. The variable current source 15 extracts a current from the node among the collector of the input transistor Q2, the emitter of the transistor Q5, and the emitter of the transistor Q6. The variable current source 16 extracts a current from the node among the collector of the input transistor Q7, the emitter of the transistor Q9, and the emitter of the transistor Q10. The variable current source 17 extracts a current from the node among the collector of the input transistor Q8, the emitter of the transistor Q11, and the emitter of the transistor Q12.

Now, a description will be given of what happens when an input signal having a predetermined frequency and containing no DC offset or distortion and thus having a duty factor of 50% is fed in via the input terminal 1, and a signal complementary to the input signal fed in via the input terminal 1 is fed in via the input terminal 2. Since the input signal fed in via the input terminal 1 has a duty factor of 50%, the phase difference between the signal fed out via the output terminal 6 and the signal fed out via the output terminal 8 is exactly 90 degrees.

Consequently, the two-phase direct-current voltages outputted from the 90-degree phase comparator 10 have the same level, and thus the variable current sources 14 and 17 and the variable current sources 15 and 16 all produce the same current (which can be zero). As a result of the variable current sources 14 to 17 producing the same current, the balance between the twin portions, composed of the transistors Q3 to Q6 and the transistors Q9 to Q12, respectively, of the dual differential circuit is not upset, and thus the phase difference between the signal fed out via the output terminal 6 and the signal fed out via the output terminal 8 is kept accurately at 90 degrees.

Figure 2:
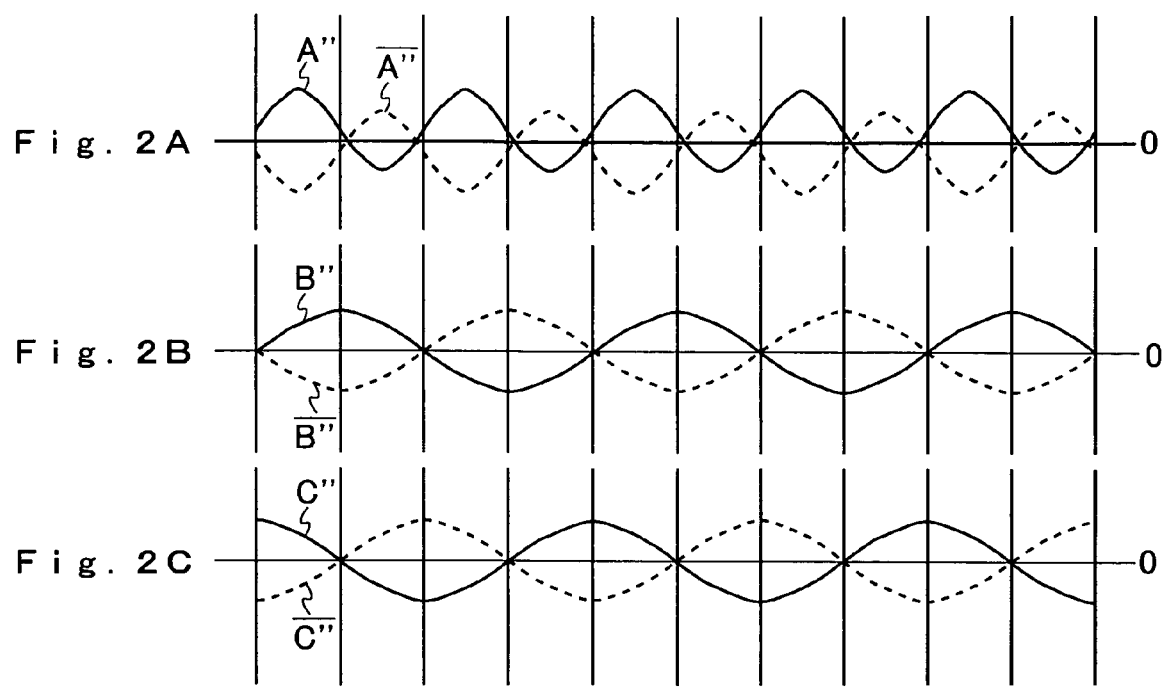
FIGS. 2A to 2C are diagrams showing an example of the time chart showing the behavior of the input and output signals as observed when the 90-degree phase shifter shown in FIG. 1 is fed with an input signal containing a DC offset.

Next, a description will be given of what happens when an input signal having a predetermined frequency and containing a DC offset and thus having a duty factor other than 50% is fed in via the input terminal 1, and a signal complementary to the input signal fed in via the input terminal 1 is fed in via the input terminal 2. In this case, the time chart of the input and output signals is, for example, as shown in FIGS. 2A to 2C. In FIG. 2A, A" indicates the input signal that is fed in via the input terminal 1, A"-bar (overscored A") indicates the input signal fed in via the input terminal 2. In FIG. 2B, B" indicates the output signal fed out via the output terminal 6, and B"-bar (overscored B") indicates the output signal fed out via the output terminal 7. In FIG. 2C, C" indicates the output signal fed out via the output terminal 8, and C"-bar (overscored C") indicates the output signal fed out via the output terminal 9.

Since the input signal A" contains a DC offset, its duty factor is not 50%. Thus, the phase difference between the signal fed out via the output terminal 6 and the signal fed out via the output terminal 8 deviates from 90 degrees. Since the duty factor of the input signal A" is higher than 50%, the 90-degree phase comparator 10 outputs the two-phase direct-current voltages with a voltage difference between them. Thus, the variable current sources 14 and 17 produce larger currents than the variable current sources 15 and 16, upsetting the balance between the twin portions, composed of the transistors Q3 to Q6 and the transistors Q9 to Q12, respectively, of the dual differential circuit. As a result, as will be clear from FIGS. 2A to 2C, the output signal B" fed out via the output terminal 6 is a signal that is obtained by performing ½ frequency division on the input signal A" and of which the zero cross points are a predetermined phase delayed relative to the rising zero cross points of the input signal A", and the output signal B"-bar fed out via the output terminal 7 is a signal complementary to the output signal B" fed out via the output terminal 6. Moreover, the output signal C" fed out via the output terminal 8 is a signal that is obtained by performing ½ frequency division on the input signal A" and of which the zero cross points are the predetermined phase advanced relative to the trailing zero cross points of the input signal A", and the output signal C"-bar fed out via the output terminal 9 is a signal complementary to the output signal C" fed out via the output terminal 8.

Through the feedback control described above, even when an input signal having a predetermined frequency and containing a DC offset and thus having a duty factor other than 50% is fed in via the input terminal 1, and a signal complementary to the signal fed in via the input terminal 1 is fed in via the input terminal 2, the phase difference between the signal fed out via the output terminal 6 and the signal fed out via the output terminal 8 can be so adjusted as to be exactly 90 degrees.

Incidentally, in a case where the input signal fed in via the input terminal 1 has a duty factor lower than 50%, the variable current sources 14 and 17 produce smaller currents than the variable current sources 15 and 16.

In the 90-degree phase shifter according to the present invention shown in FIG. 1, the phase deviation from 90 degrees is fed back as the currents produced by the variable current sources 14 to 17. This minimizes susceptibility to noise. Moreover, in the 90-degree phase shifter according to the present invention shown in FIG. 1, since the phase deviation from 90 degrees is fed back as currents, by making as short as possible the wiring between the 90-degree phase comparator 10 and the variable current sources 14 to 17, even if, for example, the wiring from the node among the collector of the input transistor Q1, the emitter of the transistor Q3, and the emitter of the transistor Q4 to the variable current source 14, or the wiring from the node among the collector of the input transistor Q2, the emitter of the transistor Q5, and the emitter of the transistor Q6 to the variable current source 15, or the wiring from the node among the collector of the input transistor Q7, the emitter of the transistor Q9, and the emitter of the transistor Q10 to the variable current source 16, or the wiring from the node among the collector of the input transistor Q8, the emitter of the transistor Q11, and the emitter of the transistor Q12 to the variable current source 17 is long, it is possible to minimize the susceptibility to the voltage drops across the wiring resistances of the paths by way of which the phase deviation from 90 degrees need to be fed back. Consequently, the 90-degree phase shifter according to the present invention shown in FIG. 1 yields output signals with a phase difference of exactly 90 degrees, operating with higher reliability than the conventional 90-degree phase shifter shown in FIG. 6.

The above description deals only with a case where an input signal having a predetermined frequency and containing a DC offset and thus having a duty factor other than 50% is fed in via the input terminal 1. Also when an input signal having a predetermined frequency and containing a distortion and thus having a duty factor other than 50% is fed in via the input terminal 1, the 90-degree phase shifter according to the present invention shown in FIG. 1 operates in a similar manner.

Next, a description will be given of the reason that the limiter circuit 13 is provided in this embodiment. When the output signals of the DC amplifier 12 are within a predetermined range, the limiter circuit 13 outputs them intact; when the output signals of the DC amplifier 12 are out of the predetermined range, the limiter circuit 13 outputs them after correcting them so that they are within the predetermined range. In this way, the limiter circuit 13 serves to limit the variable range of the variable current sources 14 to 17 within the range within which the T flip-flop operates normally as a ½ frequency divider.

Now, to evaluate the benefit of limiting the variable range of the variable current sources 14 to 17, consider how the T flip-flop operates when it starts to operate if the limiter circuit 13 is absent, i.e., if the variable range of the variable current sources 14 to 17 is not limited. Suppose that, because of variations in characteristics among the circuit elements that constitute the T flip-flop, the voltage difference (DC offset) between the two-phase direct-current voltages outputted from the 90-degree phase comparator 10 is great, and accordingly the currents produced by the variable current sources 14 to 17 vary greatly. This upsets the balance between the twin portions, composed of the transistors Q3 to Q6 and the transistors Q9 to Q12, respectively, of the dual differential circuit to such an extent that, even though the input transistors Q1, Q2, Q7, and Q8 perform switching operation according to the input signal or the signal complementary thereto, the T flip-flop no longer performs ½ frequency division. By contrast, when the limiter circuit 13 is provided and the variable range of the variable current sources 14 to 17 is limited within the range within which the T flip-flop operates normally, even if the circuit elements that constitute the T flip-flop have variations in their characteristics among them, the balance between the twin portions, composed of the transistors Q3 to Q6 and the transistors Q9 to Q12, respectively, of the dual differential circuit is not seriously upset thereby. Thus, even at start-up, the T flip-flop surely performs ½ frequency division. Once the T flip-flop starts to perform ½ frequency division, it is possible, through feedback control, to yield output signals with a phase difference of exactly 90 degrees.

In this embodiment, bipolar transistors are used to build the T flip-flop functioning as a ½ frequency divider. It is, however, also possible to use field-effect transistors instead.

What is claimed is:

1. A 90-degree phase shifter comprising:
   a T flip-flop including
     first and second input transistors that receive at control terminals thereof an input signal,
     third and fourth input transistors that receive at control terminals thereof a signal complementary to the input signal, and
     a dual differential circuit that operates according to switching operation of the first to fourth input transistors;
   a first variable current source that is connected to a node between the first input transistor and the dual differential circuit;
   a second variable current source that is connected to a node between the second input transistor and the dual differential circuit;
   a third variable current source that is connected to a node between the third input transistor and the dual differential circuit;
   a fourth variable current source that is connected to a node between the fourth input transistor and the dual differential circuit; and
   a phase comparator that compares phase differences between signals outputted from the T flip-flop in order to output signals commensurate with results of comparison, wherein the first to fourth variable current sources are controlled by signals based on the signals outputted from the phase comparator.

2. The 90-degree phase shifter of claim 1, wherein a low-pass filter is provided between the phase comparator and the first to fourth variable current sources.

3. The 90-degree phase shifter of claim 1, wherein an amplifier is provided between the phase comparator and the first to fourth variable current sources.

4. The 90-degree phase shifter of claim 1, wherein a limiter is provided that restricts a variable range of the first to fourth variable current sources.

5. The 90-degree phase shifter of claim 2, wherein an amplifier is provided between the phase comparator and the first to fourth variable current sources.

6. The 90-degree phase shifter of claim 2, wherein a limiter is provided that restricts a variable range of the first to fourth variable current sources.

7. The 90-degree phase shifter of claim 3, wherein a limiter is provided that restricts a variable range of the first to fourth variable current sources.

8. The 90-degree phase shifter of claim 5, wherein a limiter is provided that restricts a variable range of the first to fourth variable current sources.

* * * * *